(12) United States Patent
Kohara

(10) Patent No.: US 11,533,052 B2
(45) Date of Patent: Dec. 20, 2022

(54) SEMICONDUCTOR DEVICE, CLOCK CIRCUIT, AND CONTROL METHOD OF SEMICONDUCTOR DEVICE

(71) Applicant: Kioxia Corporation, Tokyo (JP)

(72) Inventor: Koji Kohara, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/189,344

(22) Filed: Mar. 2, 2021

(65) Prior Publication Data
US 2022/0014191 A1 Jan. 13, 2022

(30) Foreign Application Priority Data
Jul. 7, 2020 (JP) .............................. JP2020-117201

(51) Int. Cl.
*H03K 19/00* (2006.01)
(52) U.S. Cl.
CPC ..... *H03K 19/0016* (2013.01); *H03K 19/0013* (2013.01)
(58) Field of Classification Search
CPC ....................... H03K 19/0016; H03K 19/0013
See application file for complete search history.

(56) References Cited

U.S. PATENT DOCUMENTS

| | | | |
|---|---|---|---|
| 5,821,769 A | 10/1998 | Douseki | |
| 5,883,529 A | 3/1999 | Kumata et al. | |
| 6,111,427 A | 8/2000 | Fujii et al. | |
| 6,222,410 B1 | 4/2001 | Seno | |
| 6,380,764 B1 | 4/2002 | Katoh et al. | |
| 6,750,680 B2 | 6/2004 | Zama et al. | |
| 8,207,756 B2* | 6/2012 | Shionoiri | H01L 27/088 326/98 |
| 9,172,377 B2* | 10/2015 | Peng | G06F 1/10 |
| 10,545,556 B2* | 1/2020 | Venkatasubramanian | G06F 1/3206 |

(Continued)

FOREIGN PATENT DOCUMENTS

| | | |
|---|---|---|
| JP | 9-284101 A | 10/1997 |
| JP | 10-65517 A | 3/1998 |

(Continued)

OTHER PUBLICATIONS

Simon M. Sze, et al., "Physics of Semiconductor Devices, 3rd Edition" Wiley-Interscience, ISBN: 978-0-470-06832-8, Dec. 30, 2007, pp. 312-333 and cover pages.

(Continued)

*Primary Examiner* — Sibin Chen
(74) *Attorney, Agent, or Firm* — Oblon, McClelland, Maier & Neustadt, L.L.P.

(57) ABSTRACT

According to a certain embodiment, the semiconductor device includes a circuit block and a clock circuit configured to supply a clock signal to the circuit block at a specific timing. The clock circuit includes an output circuit configured to provide the clock signal to the circuit block, and a control circuit configured to control the timing at which the output circuit provides the clock signal. A threshold voltage of at least a transistor in the output circuit using the clock signal as input/output signals is a first threshold voltage, and a threshold voltage of a transistor configuring the control circuit is a second threshold voltage higher than the first threshold voltage.

19 Claims, 12 Drawing Sheets

(56) References Cited

U.S. PATENT DOCUMENTS

| | | | |
|---|---|---|---|
| 2005/0035411 A1* | 2/2005 | Hasegawa | G11C 5/063 |
| | | | 257/369 |
| 2008/0129359 A1* | 6/2008 | Lee | H03K 3/0375 |
| | | | 327/210 |
| 2016/0065188 A1 | 3/2016 | Singhal | |

FOREIGN PATENT DOCUMENTS

| | | |
|---|---|---|
| JP | 3463269 B2 | 11/2003 |
| JP | 3777768 B2 | 5/2006 |
| JP | 3912960 B2 | 5/2007 |
| JP | 4300598 B2 | 7/2009 |
| JP | 2011-120222 A | 6/2011 |

OTHER PUBLICATIONS

Syed Shakir Iqbal, et al., "Low Power High Density Clock Gate" https://www.designreuse.com/articles/34973/low-power-highdensity-clock-gate.html, Jul. 27, 2014, 6 pages.

* cited by examiner

|  | Tpd_RISE | Tpd_FALL |
|---|---|---|
| CG CELL 10A | 22.7ps | 18.6ps |
| FIRST COMPARATIVE EXAMPLE | 22.7ps | 18.7ps |

FIG. 7A
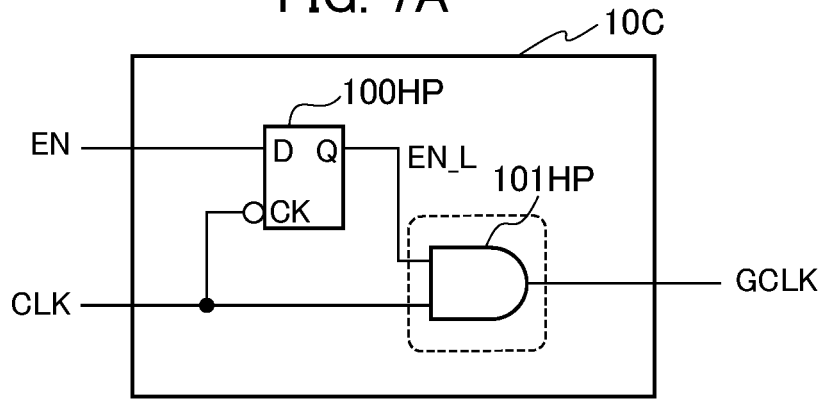
FIG. 7B
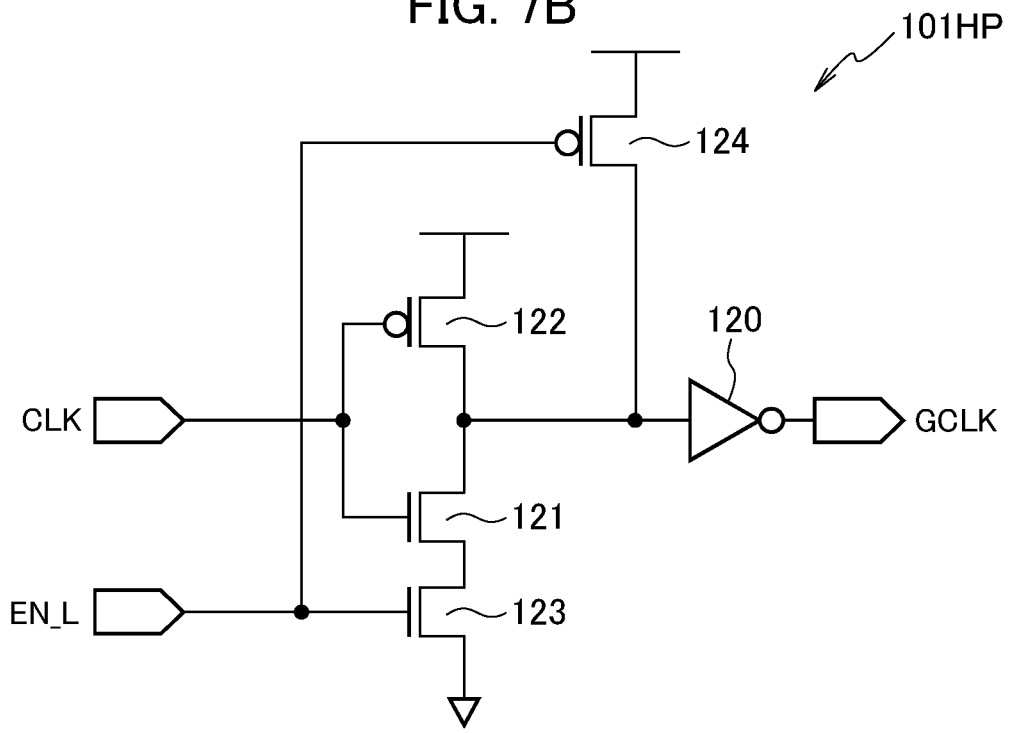
FIG. 8
| CIRCUIT NAME | n-TR 121 | n-TR 123 | p-TR 122 | p-TR 124 | NOT CIRCUIT 120 |
|---|---|---|---|---|---|
| AND CIRCUIT 101HPA | LOW Vth | HIGH Vth | LOW Vth | HIGH Vth | LOW Vth |
| AND CIRCUIT 101HPB | HIGH Vth | HIGH Vth | HIGH Vth | HIGH Vth | HIGH Vth |

|  | Tpd_RISE | Tpd_FALL |
|---|---|---|
| CG CELL 10C | 24.7ps | 18.6ps |
| CG CELL 10A | 22.7ps | 18.6ps |

SEMICONDUCTOR DEVICE, CLOCK CIRCUIT, AND CONTROL METHOD OF SEMICONDUCTOR DEVICE

CROSS REFERENCE TO RELATED APPLICATIONS

This application is based upon and claims the benefit of priority from prior Japanese Patent Application No. P2020-117201 filed on Jul. 7, 2020, the entire contents of which are incorporated herein by reference.

FIELD

Embodiments described herein relate generally to a semiconductor device, a clock circuit, and a control method of the semiconductor device.

BACKGROUND

With increase in integration and speed of semiconductor devices, there is a tendency to lower a threshold voltage of a transistor mounted in the semiconductor devices in order to support lower signal delays.

In addition, a clock gating cell configured to stop an operation of a circuit(s) of a functional block which is not used has been used, as low power consumption technology.

BRIEF DESCRIPTION OF THE DRAWINGS

FIG. 7A is a logic circuit diagram of a clock gating cell applicable to a semiconductor device according to another embodiment.

FIG. 7B is a circuit configuration diagram of an AND circuit in the clock gating cell illustrated in FIG. 7A.

FIG. 8 illustrates a transistor configuration table of transistors provided in the AND circuit illustrated in FIG. 7B.

DETAILED DESCRIPTION

Next, certain embodiments will now be described with reference to drawings. In the description of the following drawings to be explained, the identical or similar reference sign is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

Certain embodiments disclosed herein provide a semiconductor device, a clock circuit, and a control method of the semiconductor device, capable of maintaining low delay characteristics and reducing power dissipation.

According to one embodiment, the semiconductor device comprises a circuit block and a clock circuit configured to supply a clock signal to the circuit block at a specific timing. The clock circuit comprises an output circuit configured to provide the clock signal to the circuit block, and a control circuit configured to control the timing at which the output circuit provides the clock signal. A threshold voltage of at least a transistor in the output circuit using the clock signal as input/output signals is a first threshold voltage, and a threshold voltage of a transistor configuring the control circuit is a second threshold voltage higher than the first threshold voltage.

Embodiments

Figure 1:
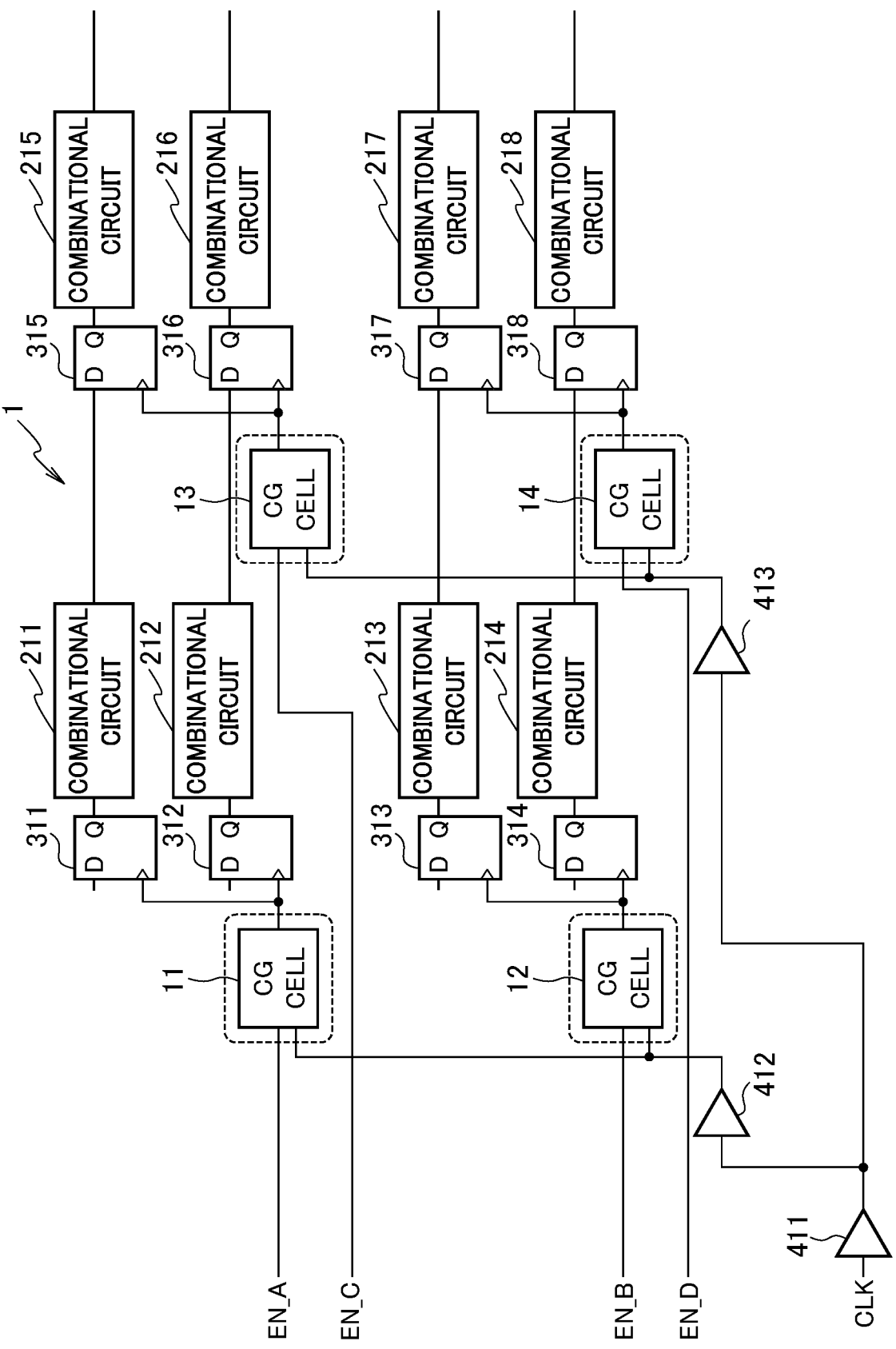
FIG. 1 is a schematic whole block configuration diagram of a semiconductor device according to an embodiment.

FIG. 1 is a schematic whole block configuration diagram of a semiconductor device 1 according to an embodiment. In FIG. 1, CG cells 11 to 14 may be configured to have a clock signal CLK and buffer circuits 411, 412, and 413 connected to the CG cells 11 to 14.

The CG cell 11 uses a clock signal CLK and an enable signal EN_A as input signals, and may be configured to have sequential circuits (e.g., flip flop circuits 311 and 312) connected to a clock signal GCLK provided from the CG cell 11.

The CG cell 12 uses a clock signal CLK and an enable signal EN_B as input signals, and may be configured to have sequential circuits (e.g., flip flop circuits 313 and 314) connected to a clock signal GCLK provided from the CG cell 12.

The CG cell 13 uses a clock signal CLK and an enable signal EN_C as input signals, and may be configured to have sequential circuits (e.g., flip flop circuits 315 and 316) connected to a clock signal GCLK provided from the CG cell 13. Moreover, the sequential circuits (e.g., flip flop circuits 315 and 316) are respectively connected to combinational circuits (e.g., combinational circuits 215 and 216), and the combinational circuits (e.g., combinational circuits 215 and 216) are respectively connected to output lines for providing signals.

The CG cell 14 uses a clock signal CLK and an enable signal EN_D as input signals, and may be configured to have sequential circuits (e.g., flip flop circuits 317 and 318) connected to a clock signal GCLK provided from the CG cell 14. Moreover, the sequential circuits (e.g., flip flop circuits 317 and 318) are respectively connected to combinational circuits (e.g., combinational circuits 217 and 218), and the combinational circuits (e.g., combinational circuits 217 and 218) are respectively connected to output lines for providing signals.

Note that, in the following explanation, the sequential circuits (e.g., the flip flop circuits 311 to 318) respectively connected to the clock signals GCLK provided from the CG cells 11 to 14 and the combinational circuits (e.g., the combinational circuits 211 to 218) respectively connected to the sequential circuits using the output signals of the CG cells 11 to 14 as input signals are also collectively referred to as a circuit block. Moreover, the outputs of the circuit blocks A to D are respectively the same as the outputs of the combinational circuits 215 to 218.

Figure 2:
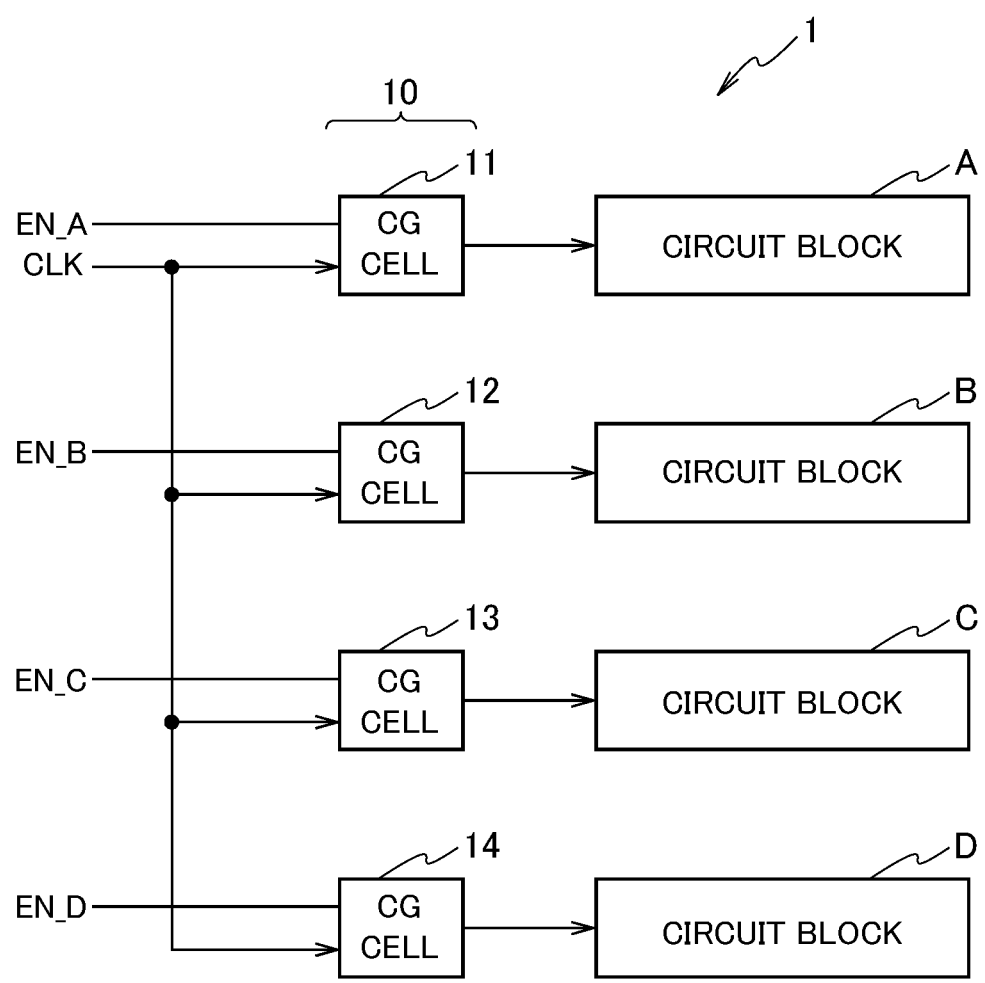
FIG. 2 is a schematic whole block outline diagram of the semiconductor device according to the embodiment.

FIG. 2 is a schematic diagram of the whole schematic block of the semiconductor device 1 according to the embodiment. As illustrated in FIG. 2, CG cells 11 to 14 respectively use a clock signal CLK and enable signals EN_A to EN_D as input signals, and respectively control to supply clock signals GCLK to circuit blocks A to D. Moreover, the CG cells 11 to 14 are respectively connected to the circuit blocks A to D, as illustrated in FIG. 2.

In the following description, the CG cells 11 to 14 are also collectively referred to as a CG cell 10 or a clock circuit. Moreover, the enable signals EN_A to EN_D are also collectively referred to as an enable signal EN. The CG cell 10 provides the clock signal GCLK in response to the input of the enable signal EN. The CG cell 10 functions as a clock gating cell that controls operation or suspension of each circuit block by entering the enable signal EN (e.g., "0" or "1") for enabling or disabling the clock supply to each circuit block.

Next, the symbols "H", "L", "P", and "N" respectively added after the reference signs of a latch circuit 100, an AND circuit 101, and an OR circuit 102 will now be explained.

"H" indicates a circuit in a case where a threshold value of transistors constituting the circuit is relatively high, and "L" indicates a circuit in a case where the threshold value of the transistors constituting the circuit is relatively low.

Moreover, "P" indicates that the circuit is a rising edge trigger type circuit, and "N" indicates that the circuit is a falling edge trigger type circuit.

(CG Cell 10A)

A CG cell 10A applicable to the semiconductor device 1 according to the embodiment will now be described.

Figure 3A:
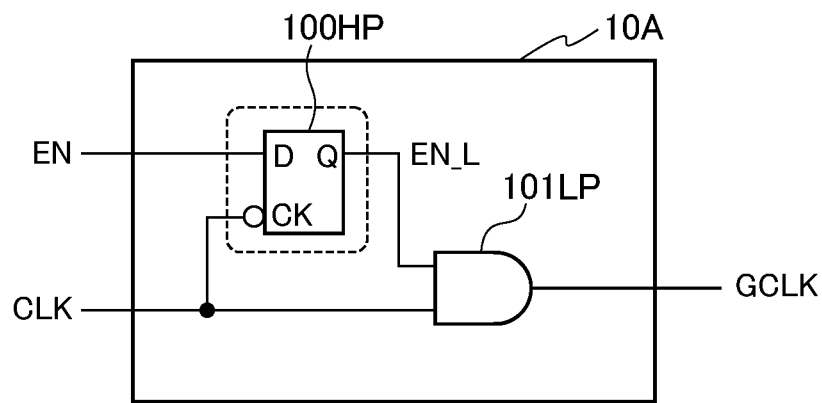
FIG. 3A is a logic circuit diagram of a clock gating cell in the semiconductor device according to the embodiment.

FIG. 3A is a logic circuit diagram of the CC cell 10A applicable to the semiconductor device 1 according to the embodiment. FIG. 3A illustrates an example of the CG cell 10A.

The CG cell 10A illustrated in FIG. 3A is configured including a latch circuit 100HP (e.g., D-type latch circuit) which is an example of a control circuit provided in the CG cell 10A, and an AND circuit 101LP which is an example of an output circuit provided in the CG cell 10A.

The CG cell 10A composed of the latch circuit 100HP and the AND circuit 101LP is a rising edge trigger type clock circuit for positive clock.

An input terminal of the CG cell 10A is connected to an input line of the enable signal EN and an input line of the clock signal CLK, each input from an outside, as illustrated in FIG. 3A. An input terminal of the latch circuit 100HP is connected to the input line of the enable signal EN and the input line of the clock signal CLK. An input terminal of the AND circuit 101LP is connected to the output line of enable signal EN_L provided from the latch circuit 100HP and the input line of the clock signal CLK. An output terminal of CG cell 10A is connected to an output line of a clock signal GCLK provided from the AND circuit 101LP.

Figure 3B:
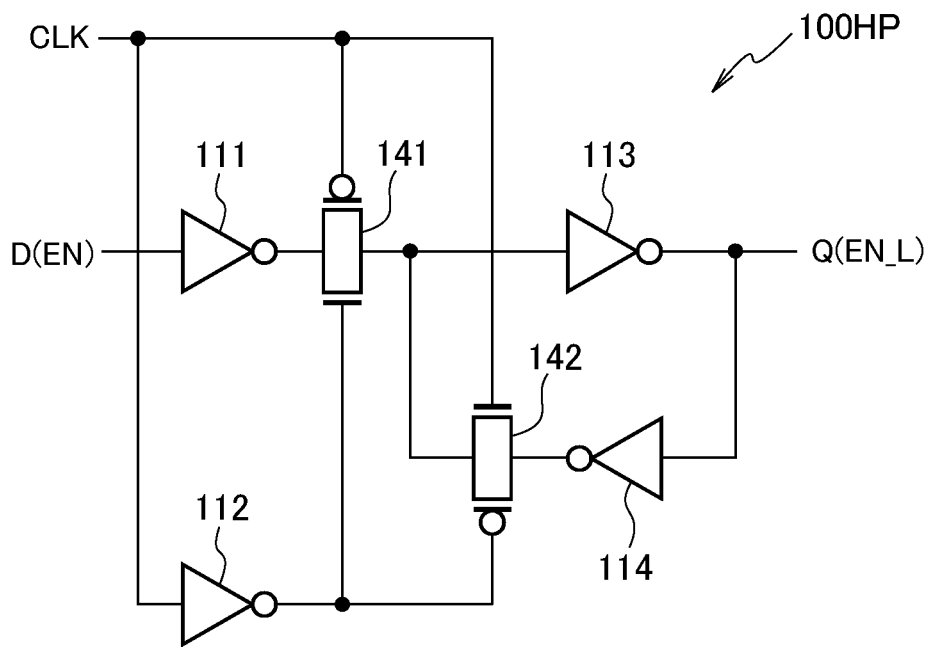
FIG. 3B is a circuit configuration diagram of a latch circuit in the clock gating cell illustrated in FIG. 3A.

FIG. 3B is a circuit configuration diagram of the latch circuit 100HP provided in the CG cell 10A illustrated in FIG. 3A. FIG. 3B illustrates an example of the latch circuit 100HP provided in the CG cell 10A illustrated in FIG. 3A.

Specifically, the latch circuit 100HP is configured including four NOT circuits (e.g., NOT circuits 111 to 114) and two transfer gates (e.g., transfer gates 141 and 142), as illustrated in FIG. 3B.

On one hand, a gate input of the transfer gate 141 is connected to the input line of the clock signal CLK. On the other hand, the gate input of the transfer gate 141 is connected to the input line of the clock signal CLK via the NOT circuit 112.

Furthermore, the input line of the transfer gate 141 is connected to the enable signal EN via the NOT circuit 111, and an output thereof is connected to an input line of the NOT circuit 113 and an input line of the transfer gate 142.

On one hand, a gate input of the transfer gate 142 is connected to the input line of the clock signal CLK. On the other hand, the gate input of the transfer gate 142 is connected to the input line of the clock signal CLK via the NOT circuit 112.

Furthermore, an output of the transfer gate 142 is connected to the NOT circuit 114.

The NOT circuit 113 and the NOT circuit 114 are connected to an output line of the enable signal EN_L provided from the latch circuit 100HP.

A threshold voltage of all transistors (e.g., field effect transistor) provided in the latch circuit 100HP is higher than a threshold voltage of all transistors (e.g., field effect transistor) provided in the AND circuit 101LP.

In other words, the threshold voltage of the transistors provided in the latch circuit 100HP of the CG cell 10A is set to be higher than the threshold voltage of the transistors provided in the AND circuit 101LP of the CG cell 10A, thereby suppressing increase in power dissipation due to a leakage current of the transistor.

The latch circuit 100HP provides the enable signal EN as an enable signal EN_L, when the clock signal CLK is at a high level. On the other hand, when the clock signal CLK is at a low level, a flow of data is interrupted and the latch circuit 100HP holds previous data output.

That is, in the CG cell 10A, the enable signal EN is sampled at a rising edge of the clock signal CLK in the latch circuit 100HP, and the output of the clock signal GCLK is controlled by passing or blocking a clock pulse immediately after the sampling in accordance with a value thereof by the AND circuit 101LP.

More specifically, the AND circuit 101LP provided in the CG cell 10A provides the clock signal GCLK on the basis of the enable signal EN_L provided from the latch circuit 100HP and the clock signal CLK. Therefore, since the clock signal GCLK is required to have a low delay characteristic of the clock signal, all the transistors (e.g., field effect transistors) provided in the AND circuit 101LP should be low threshold voltage transistors.

First Comparative Example of CG Cell 10A

Increasing the threshold voltage of the transistor suppresses a leakage current of the transistor, but it is also considered that a switching speed of the transistor is reduced and the propagation of the clock signal is affected.

Therefore, even if the threshold voltage of the transistors provided in the latch circuit 100HP is set to be higher than the threshold voltage of the transistors provided in the AND circuit 101LP of the CG cell 10A, the fact that there is no effect on the propagation of the clock signal will be described in comparison with a latch circuit composed of all transistors having a low threshold voltage.

As a comparative example of the CG cell 10A, a first comparative example of the CG cell 10A will now be described. In the following description, the first comparative example of the CG cell 10A is also referred to as a first comparative example.

The difference in the configuration of the logic circuit between the CG cell 10A and the first comparative example is that the latch circuit provided in the CG cell 10A illustrated in FIG. 3A is replaced by a latch circuit 100LP in the first comparative example.

The threshold voltage of the transistors provided in the latch circuit 100LP is lower than the threshold voltage of the transistors provided in the latch circuit 100HP and is the same as the threshold voltage of the transistors provided in the AND circuit 101LP.

More specifically, the first comparative example has a transistor configuration in consideration of low delay characteristics although a leakage current is increased.

Figures 4, 5:
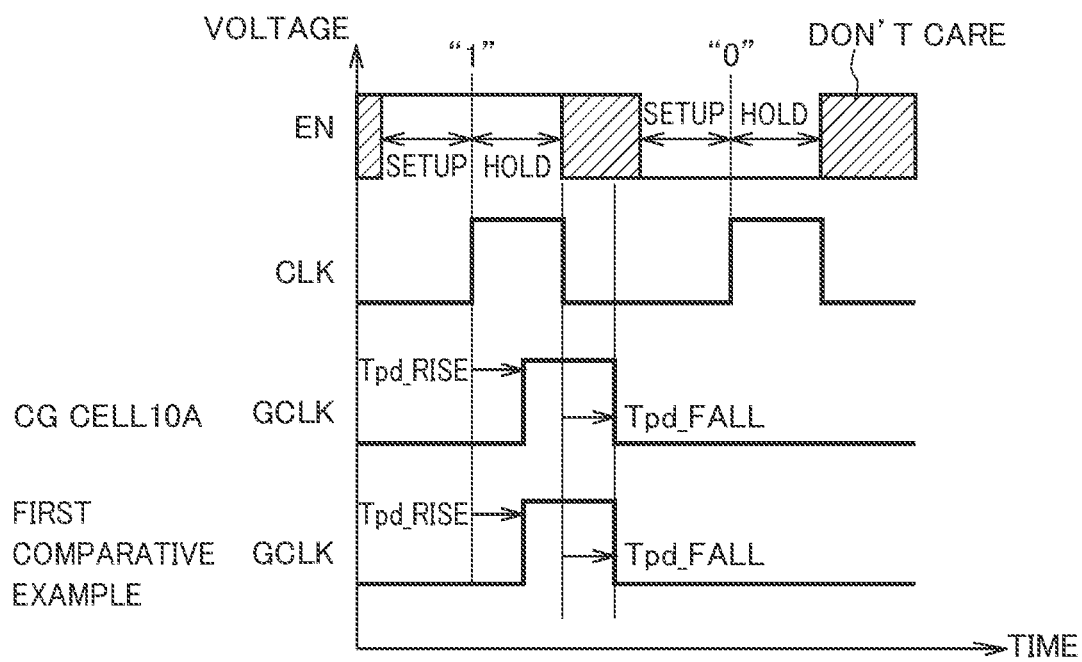
FIG. 4 illustrates an example of an operating waveform of the clock gating cell.
FIG. 5 illustrates a table illustrating a simulation result of rise/fall time of the clock gating cell.

Next, there will be described a comparison between an operating waveform of the CG cell 10A applicable to the semiconductor device 1 according to the embodiment and an operating waveform in the first comparative example. FIG. 4 illustrates an example of an operating waveform of the CG cell 10A and an operating waveform of the CG cell of the first comparative example.

FIG. 4 illustrates an enable signal EN and a clock signal CLK which are entered into the CG cell 10A and the CG cell of the first comparative example, and a clock signal GCLK provided from the CG cell 10A and a clock signal GCLK provided from the CG cell of the first comparative example. The delay time Tpd_RISE indicates a time period from a rising edge of the clock signal CLK to a rising edge of the clock signal GCLK provided from each CG cell. Similarly, the delay time Tpd_FALL indicates a time period from a falling edge of the clock signal CLK to a falling edge of the clock signal GCLK provided from each CG cell. In the following description, the time period from the rising edge of the clock signal CLK to the rising edge of the clock signal GCLK provided from each CG cell is referred to as the rising delay time Tpd_RISE. Moreover, the time period from the falling edge of the clock signal CLK to the falling edge of the clock signal GCLK provided from each CG cell is referred to as the falling delay time Tpd_FALL.

As illustrated in FIG. 4, the rising delay time Tpd_RISE and the falling delay time Tpd_FALL of the CG cell 10A are not respectively different from the rising delay time Tpd_RISE and the falling delay time Tpd_FALL of the first comparative example.

In other words, even if the threshold voltage of all the transistors in the latch circuit 100HP of the CG cell 10A is set to be higher than the threshold voltage of all the transistors in the AND circuit 101LP, it does not affect the delay time of the clock signal GCLK provided from the CG cell 10A.

FIG. 5 illustrates a table showing a simulation result of the rise/fall time in the CG cell 10A and the CG cell of the first comparative example. The delay time Tpd_RISE illustrated in FIG. 5 is rising delay time of the simulation result. The delay time Tpd_FALL illustrated in FIG. 5 is falling delay time of the simulation result.

As illustrated in FIG. 5, both the delay time Tpd_RISE of the CG cell 10A and the rising delay time Tpd_RISE of the CG cell of the first comparative example by the simulation are 22.7 ps.

As described above, according to the semiconductor device 1 according to the embodiment, it is possible to provide a semiconductor device 1 that reduces power dissipation while maintaining low delay characteristics of the clock signals with respect to the CG cell 10 in the clock line.

Modified Example of Embodiment

Next, a CG cell 10B applicable to a semiconductor device 1 according to a modified example of the embodiment will now be described.

Figure 6A:
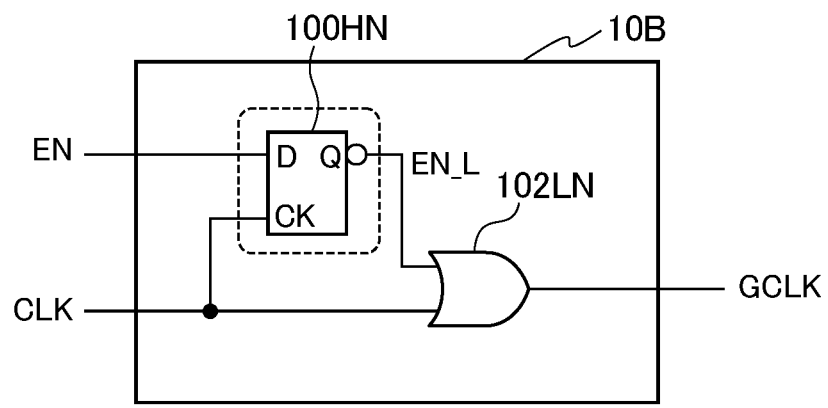
FIG. 6A is a logic circuit diagram of a clock gating cell of a semiconductor device according to a modified example of the embodiment.

FIG. 6A is a logic circuit diagram of the CG cell 10B applicable to the semiconductor device 1 according to a modified example of the embodiment. FIG. 6A illustrates an example of the CG cell 10B.

The CG cell 10B illustrated in FIG. 6A is configured including a latch circuit 100HN (e.g., D-type latch circuit) which is an example of a control circuit provided in the CG cell 10B, and an OR circuit 102LN which is an example of an output circuit provided in the CG cell 10B.

The difference in the configuration of the logic circuit between the CG cell 10B and the CG cell 10A is that the latch circuit provided in the CG cell 10B illustrated in FIG. 6A is replaced by a latch circuit 100HN in the first comparative example. Moreover, in the CG cell 10B, the OR circuit 102LN is used instead of the AND circuit 101LP.

A threshold voltage of all transistors (e.g., field effect transistor) provided in the latch circuit 100HN is set to be higher than a threshold voltage of all transistors (e.g., field effect transistor) provided in the OR circuit 102LN.

Low threshold voltage transistors are used for all the transistors (e.g., field effect transistor) provided in the OR circuit 102LN.

The CG cell 10B composed of the latch circuit 100HN and the OR circuit 102LN is a falling edge trigger type clock circuit for negative clock.

An input terminal of the CG cell 10B is connected to an input line of the enable signal EN and an input line of the clock signal CLK, each input from an outside, as illustrated in FIG. 6A. An input terminal of the latch circuit 100HN is connected to the input line of the enable signal EN and the input line of the clock signal CLK. An input terminal of the OR circuit 101LN is connected to the output line of enable signal EN_L provided from the latch circuit 100HN and the input line of the clock signal CLK. An output terminal of CG cell 10B is connected to an output line of a clock signal GCLK provided from the OR circuit 102LN.

Figure 6B:
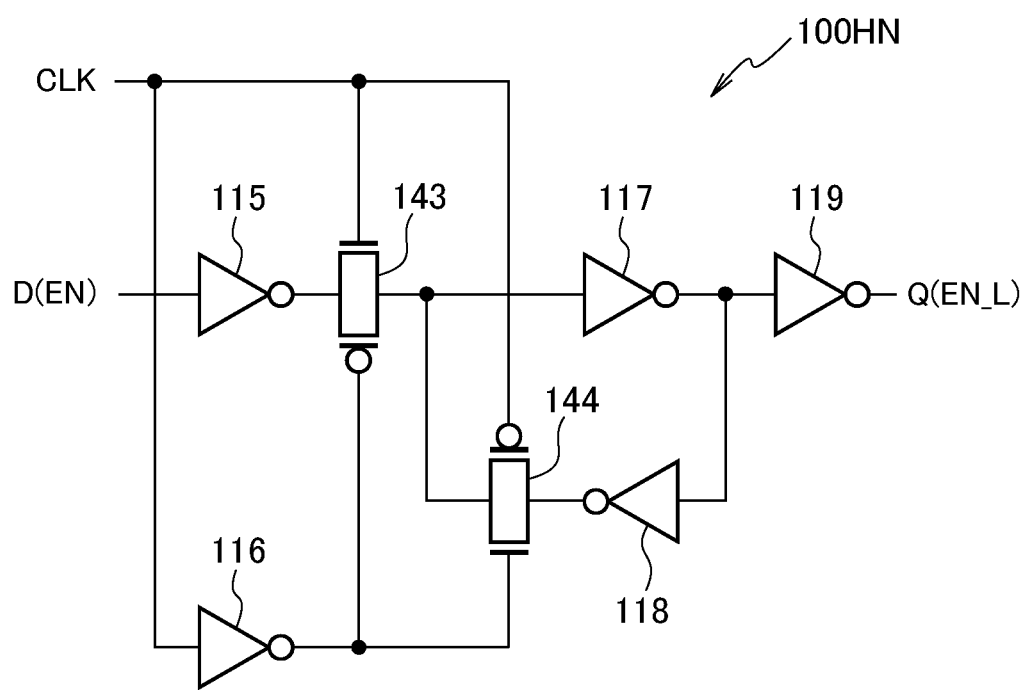
FIG. 6B is a circuit configuration diagram of a latch circuit in the clock gating cell illustrated in FIG. 6A.

FIG. 6B is a circuit configuration diagram of the latch circuit 100HN provided in the CG cell 10B illustrated in FIG. 6A. FIG. 6B shows an example of the latch circuit 100HN provided in the CG cell 10B illustrated in FIG. 6A.

Specifically, the latch circuit 100HN is configured including five NOT circuits (e.g., NOT circuits 115 to 119) and two transfer gates (e.g., transfer gates 143 and 144), as illustrated in FIG. 6B.

On one hand, a gate input of the transfer gate 143 is connected to the input line of the clock signal CLK. On the other hand, the gate input of the transfer gate 143 is connected to the input line of the clock signal CLK via the NOT circuit 116.

Furthermore, the input line of the transfer gate 143 is connected to the enable signal EN via the NOT circuit 115, and an output thereof is connected to an input line of the NOT circuit 117 and an input line of the transfer gate 144.

On one hand, a gate input of the transfer gate 144 is connected to the input line of the clock signal CLK. On the other hand, the gate input of the transfer gate 144 is connected to the input line of the clock signal CLK via the NOT circuit 116.

Furthermore, an output of the transfer gate 144 is connected to the NOT circuit 118.

The NOT circuit 117 and the NOT circuit 118 are connected to an output line of the enable signal EN_L provided from the latch circuit 100HN via the NOT circuit 119.

In the operation of the CG cell 10B, the enable signal EN is sampled at a rising edge of the clock signal CLK of the CG cell 10A at the falling edge of the clock signal CLK, and the output of the clock signal GCLK is controlled by passing or blocking a clock pulse immediately after the sampling in accordance with a value thereof by the OR circuit 102LN.

In the operating waveforms and effects of the CG cell 10B illustrated in FIG. 6, the rising edge of the clock signal CLK provided in the CG cell 10A is replaced by the falling edge of the clock signal CLK. Since the basic operation and effects of the CG cell 10B are the same as those of the CG cell 10A, the drawing and explanation thereof are omitted.

Another Embodiment

Next, a CG cell 100 applicable to a semiconductor device 1 according to another embodiment will now be described.

FIG. 7A is a logic circuit diagram of the CG cell 10C applicable to the semiconductor device 1 according to the other embodiment. FIG. 7A illustrates an example of the CG cell 10C.

The CG cell 10C illustrated in FIG. 7A is configured including a latch circuit 100HP (e.g., D-type latch circuit) which is an example of a control circuit provided in the CG cell 100, and an AND circuit 101HP which is an example of an output circuit provided in the CG cell 100.

The threshold voltage of the transistors (e.g., n-channel field effect transistor (n-channel FET) 121 and p-channel field effect transistor (p-channel FET) 122), using the clock signal CLK as an input signal, provided in the AND circuit 101HP is set to be lower than the threshold voltage of the transistors (e.g., n-channel field effect transistor (n-channel FET) 123 and p-channel field effect transistor (p-channel FET) 124), using the enable signal EN as an input signal, as illustrated in FIG. 7B.

More specifically, in the CG cell 100, the threshold voltage of all the transistors provided in the latch circuit 100HP and the threshold voltage of the transistors which does not use the clock signal CLK as the input signal provided in the AND circuit 101HP are higher than the threshold voltage of the transistors using the clock signal as the input signal CLK provided in the AND circuit 101HP.

The CG cell 100 composed of the latch circuit 100HN and the AND circuit 101HP is a rising edge trigger type clock circuit for positive clock.

The difference in the configuration of the logic circuit between the CG cell 10C and the CG cell 10A is that the AND circuit provided in the CG cell 10A illustrated in FIG. 6A is replaced by a AND circuit 101HP. The rest of the configuration in the CG cell 10C is the same as that of the embodiment.

FIG. 7B is a circuit configuration diagram of the AND circuit 101HP provided in the CG cell 100 illustrated in FIG. 7A. FIG. 7B illustrates an example of the AND circuit 101HP provided in the CG cell 10C illustrated in FIG. 7A.

Specifically, the AND circuit 101HP is configured including two n-channel transistors (e.g., n-channel field effect transistors (n-channel FETs) 121 and 123) and two p-channel transistors (e.g., p-channel field effect transistors (p-channel FETs) 122 and 124) and the NOT circuit 120, as illustrated in FIG. 7B.

In the following description, the n-channel field effect transistor (n-channel FET) and the p-channel field effect transistor (p-channel FET) are respectively also referred to as n-TR and p-TR.

A gate input of each of the n-TR 121 and the p-TR 122 is connected to the input line of the clock signal CLK. A drain of each of the p-TR 122 and the n-TR 121 is connected to a drain of the p-TR 124 and the NOT circuit 120.

A gate input of each of the n-TR 123 and the p-TR 124 is connected to the input line of the enable signal EN. A source of each of the p-TR 122 and the p-TR 124 is connected to power supply. A source of the n-TR 121 is connected to a drain of the n-TR 123. A source of the n-TR 123 is connected to a ground GND.

The NOT circuit 120 is connected to the output line of the clock signal GCLK provided from the AND circuit 101HP.

Second Comparative Example of CG Cell 10C

It is considered that there will be a difference in the effect of the propagation of the clock signal CLK between the case where only the transistors not using the clock signal CLK as the input signal provided in the AND circuit 101HP have a high threshold voltage and the case where all the transistors having the transistors using the clock signal CLK as the input signal provided in the AND circuit 101HP have a high threshold voltage.

As explained below, the case where only the transistors not using the clock signal CLK as the input signal provided in the AND circuit 101HP have a high threshold voltage has no effect on the propagation of the clock signal CLK compared to the case where all the transistors having the transistors using the clock signal CLK as the input signal provided in the AND circuit 101HP have a high threshold voltage.

As a comparative example of the CG cell 10C, a second comparative example of the CG cell 10C will now be described. In the following description, the second comparative example of the CG cell 10C is also referred to as the second comparative example.

A difference in the configuration of the logic circuit between the CG cell 10C and a CG cell of the second comparative example corresponds to a difference between the threshold voltage of the transistors provided in the AND circuit 101HP of the CG cell 10C and the threshold voltage of the transistors provided in the AND circuit 101HP of the second comparative example.

In the second comparative example, the threshold voltage of all the transistors provided in the AND circuit 101HP is set to be higher than the threshold voltage of the transistors using the clock signal as the input signal provided in the AND circuit 101HP of the CG cell 100.

The transistors provided in the AND circuit 101HP in the CG cell 10C have a threshold voltage configuration of the transistors of the AND circuit 101HPA illustrated in FIG. 8.

The transistors provided in the AND circuit 101HP in the second comparative example have a threshold voltage configuration of the transistors of the AND circuit 101HPB illustrated in FIG. 8. FIG. 8 illustrates a configuration table of the threshold voltage of the transistors provided in the AND circuit 101HP of the CG cell 10C and the threshold voltage of the transistors provided in the AND circuit 101HP illustrated in FIG. 7B of the second comparative example.

Figures 9, 10:
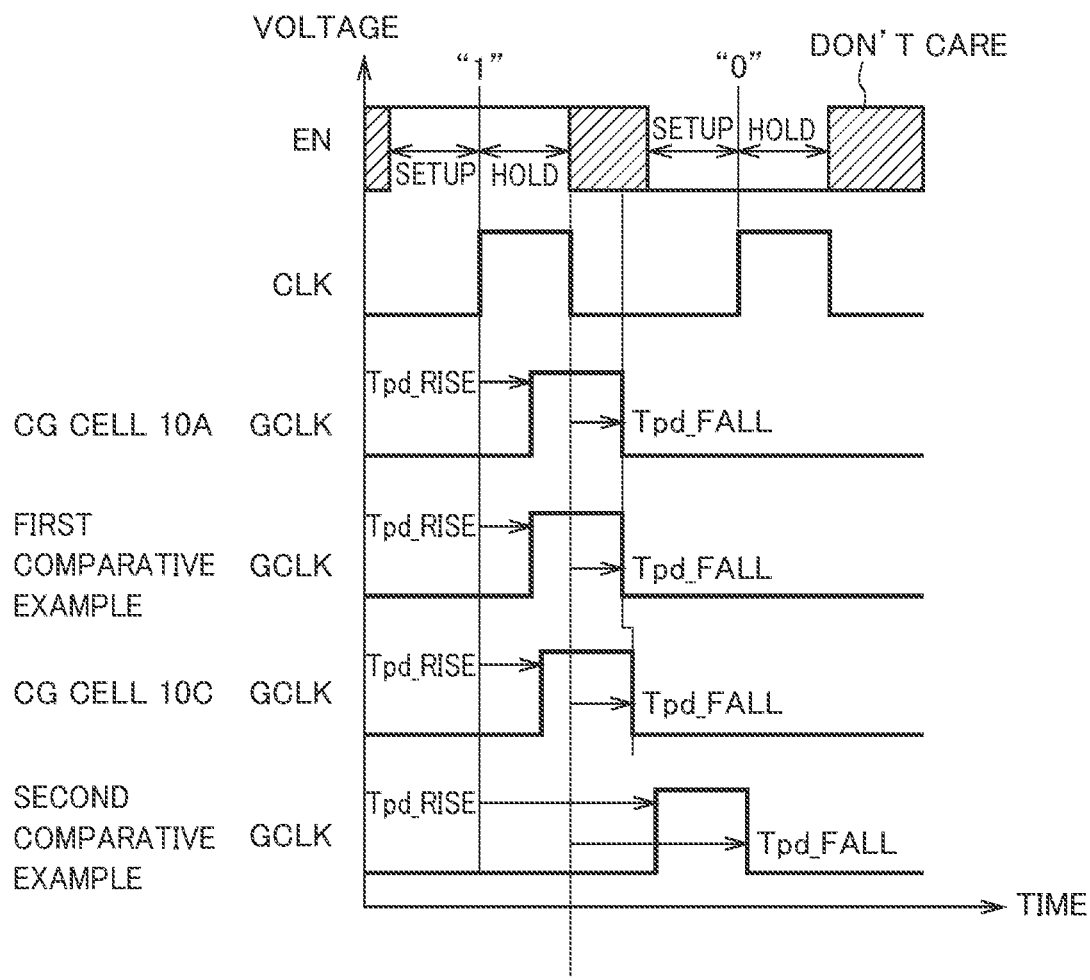
FIG. 9 illustrates an example of an operating waveform of the clock gating cell in the semiconductor devices according to the other embodiment.
FIG. 10 is a table illustrating a simulation result of rise/fall time of the clock gating cell in the semiconductor devices according to the other embodiment.

Next, there will be described a comparison between an operating waveform of the CG cell 10C applicable to the semiconductor device 1 according to the embodiment and an operating waveform in the second comparative example. FIG. 9 illustrates an example of an operating waveform of the CG cell 10C and an operating waveform of the CG cell of the second comparative example.

FIG. 9 illustrates the enable signal EN and the clock signal CLK which are entered into the CG cell 10A, the CG cell of the first comparative example, the CG cell 10C, and the CG cell of the second comparative example; and the clock signals GCLK respectively provided from the CG cell 10A, the CC cell of the first comparative example, the CG cell 10C, and the CG cell of the second comparative example.

The rising delay time Tpd_RISE indicates a time period from a rising edge of the clock signal CLK to a rising edge of the clock signal GCLK provided from each CG cell. Similarly, the falling delay time Tpd_FALL indicates a time period from a falling edge of the clock signal CLK to a falling edge of the clock signal GCLK provided from each CG cell.

The rising delay time Tpd_RISE of the CG cell 100 is a little large than the rising delay time Tpd_RISE of the CG cell 10A and the first comparative example, as illustrated in FIG. 9, but the effect due to the rise delay time Tpd_RISE is relatively small.

The rising delay time Tpd_RISE and the falling delay time Tpd_FALL of the CG cell of the second comparative example are larger than those of the CG cell 10A, the CG cell of the first comparative example, and the CG cell 100, as illustrated in FIG. 9, and the effect due to the rising delay time Tpd_RISE and the falling delay time Tpd_FALL is relatively large.

FIG. 10 illustrates a table illustrating a simulation result of the rise/fall time of the CG cell 100 and the rise/fall time of the CG cell 10A. The delay time Tpd_RISE illustrated in FIG. 10 is rising edge delay time of the simulation result. The delay time Tpd_FALL illustrated in FIG. 10 is falling edge delay time of the simulation result.

As illustrated in FIG. 10, the delay time Tpd_RISE of the CG cell 10C is 24.7 ps, and the delay time Tpd_RISE of the CG cell 10A is 22.7 ps.

More specifically, in the CG cell 100, even if the threshold voltage of all the transistors provided in the latch circuit 100HP and the threshold voltage of the transistors not using the clock signal as the input signal provided in the AND circuit 101HP are all set to be higher than the threshold voltage of the transistors using the clock signal as the input signal provided in the AND circuit 101HP, the effect on the delay time of the clock signal GCLK provided from the CG cell 10C is small.

(Timing Condition)

Next, timing conditions of the CG cell 10 and replacement of the CG cell 10 will now be described.

Although the delay time of the clock signal GCLK provided from the CG cell 10 has been described until now, required setup time and hold time for operating the latch circuit are specified in the latch circuit in the CG cell 10. Therefore, the latch circuit in the CG cell 10 needs to satisfy an operating range of the required setup time and hold time for operating the latch circuit.

More specifically, there are timing conditions of the required setup time and hold time for operating the latch circuit, in the latch circuit in the CG cell 10.

In the following description, when the transistor provided in the latch circuit in the CG cell 10 has a relatively high threshold voltage, the time period to prepare the enable signal EN with respect to the clock edge of the clock signal CLK in the latch circuit in the CG cell 10 is also referred to as setup time 130HP. Moreover, the time period for holding the enable signal EN with respect to the clock edge of the clock signal CLK of the latch circuit in the CG cell 10 is also referred to as hold time 131HP.

On the other hand, when the transistor provided in the latch circuit in the CG cell 10 has a relatively low threshold voltage, the time period to prepare the enable signal EN with respect to the clock edge of the clock signal CLK in the latch circuit in the CG cell 10 is also referred to as setup time 130LP. Moreover, the time period for holding the enable signal EN with respect to the clock edge of the clock signal CLK of the latch circuit in the CG cell 10 is also referred to as hold time 131LP.

Figure 11A:
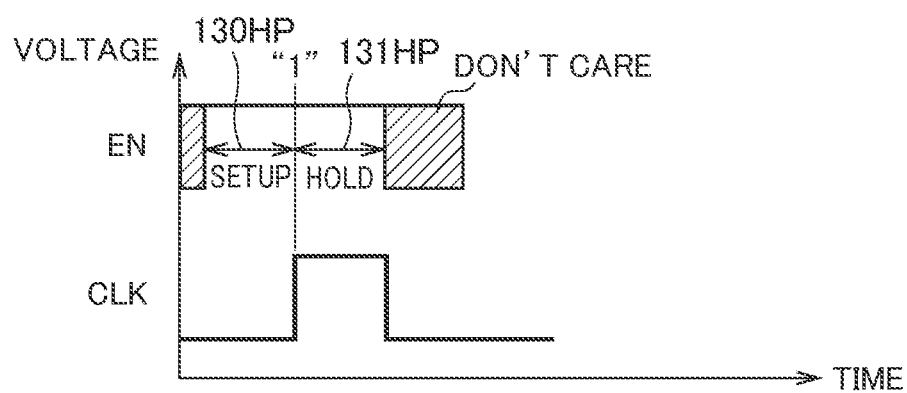
FIG. 11A is an operating waveform diagram illustrating a constraint of setup time and hold time of the clock signal when transistors configured in the latch circuit in the clock gating cell have a relatively high threshold voltage.

FIG. 11A is an operating waveform diagram illustrating a constraint of setup time 130HP and hold time 131HP of the clock signal CLK when transistors configured in the latch circuit in the CG cell 10 have a relatively high threshold voltage.

Figure 11B:
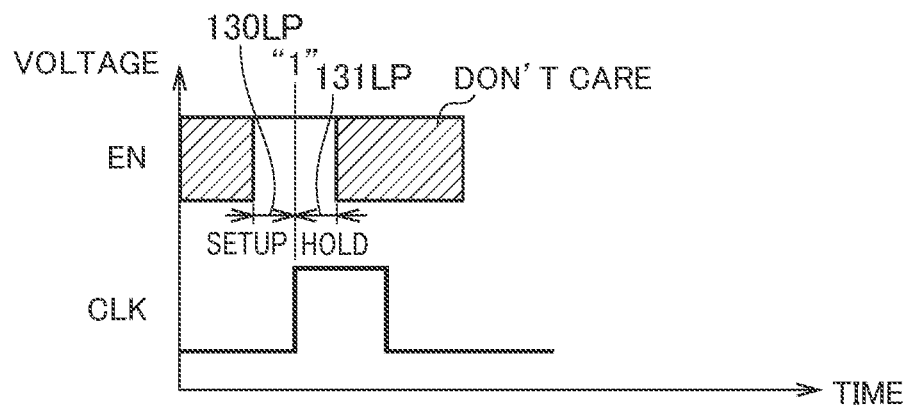
FIG. 11B is an operating waveform diagram illustrating a constraint of setup time and hold time of the clock signal when transistors configured in the latch circuit in the clock gating cell have a relatively low threshold voltage.

FIG. 11B is an operating waveform diagram illustrating a constraint of setup time 130LP and hold time 131LP of the clock signal CLK when transistors configured in the latch circuit in the CG cell 10 have a relatively low threshold voltage.

Since the transistor provided in the latch circuit in CG cell 10 has a relatively high threshold voltage, the setup time 130HP and the hold time 131HP illustrated in FIG. 11A become longer than the setup time 130LP and the hold time 131LP illustrated in FIG. 11B.

Figure 11C:
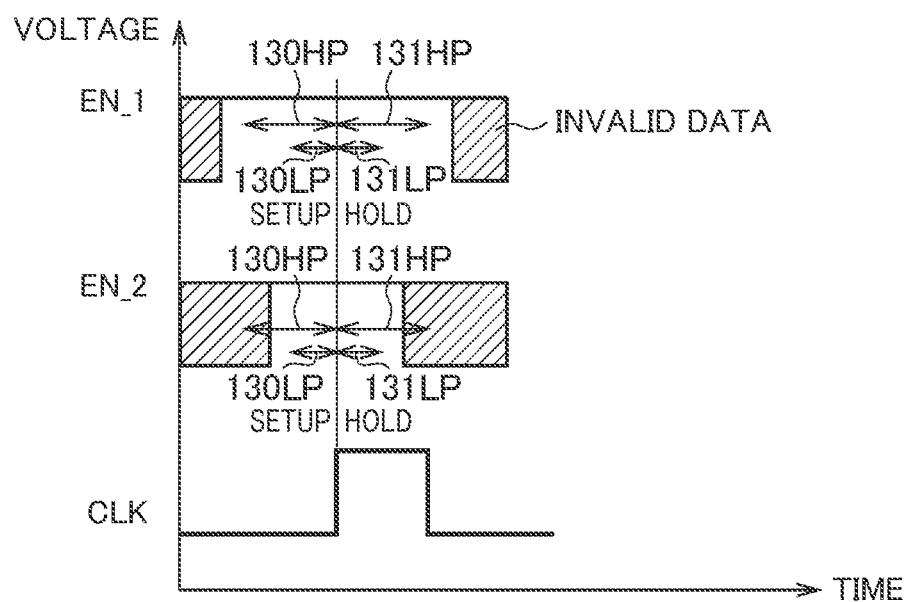
FIG. 11C is an operating waveform diagram illustrating whether a clock gating cell A with long time for an enable signal EN_1 to be enabled and a clock gating cell B with short time of an enable signal EN_2 to be enabled can be replaced by a clock gating cell in which transistors of the latch circuit in the clock gating cell have a relatively high threshold voltage or a clock gating cell in which transistors of the latch circuit in the clock gating cell have a relatively low threshold voltage.

FIG. 11C is an operating waveform diagram illustrating whether a CG cell A with long time for an enable signal EN_1 to be enabled and a CG cell B with short time of an enable signal EN_2 to be enabled can be replaced by a CG cell in which transistors of the latch circuit in the CG cell have a relatively high threshold voltage or a CG cell in which transistors of the latch circuit in the CG cell have a relatively low threshold voltage.

More specifically, since the CG cell A with long time for the enable signal EN_1 to be enabled satisfies the constraint of the setup time 130HP and the hold time 131HP, as illustrated in FIG. 11C, the CG cell A with long time for the enable signal EN_1 to be enabled can be replaced by the CG cell 10 in which the relatively high threshold voltage transistor provided in the latch circuit. However, since the CG cell A with short time for the enable signal EN_2 to be enabled does not satisfy the constraint of the setup time 130HP and the hold time 131HP, as illustrated in FIG. 11C, the CG cell A with short time for the enable signal EN_2 to be enabled cannot be replaced by the CG cell 10 in which the relatively high threshold voltage transistor provided in the latch circuit.

(Device Structure)

Next, the transistor provided in the CG cell 10 applicable to the semiconductor device 1 according to some embodiments can realize different threshold voltages by changing a device structure of the transistor.

Hereinafter, differences in the device configurations of transistors that realize different threshold voltages will now described with reference to the internal configurations of n-channel metal oxide semiconductor field effect transistors (MOSFETs) illustrated in FIGS. 12 to 15.

Figure 12:
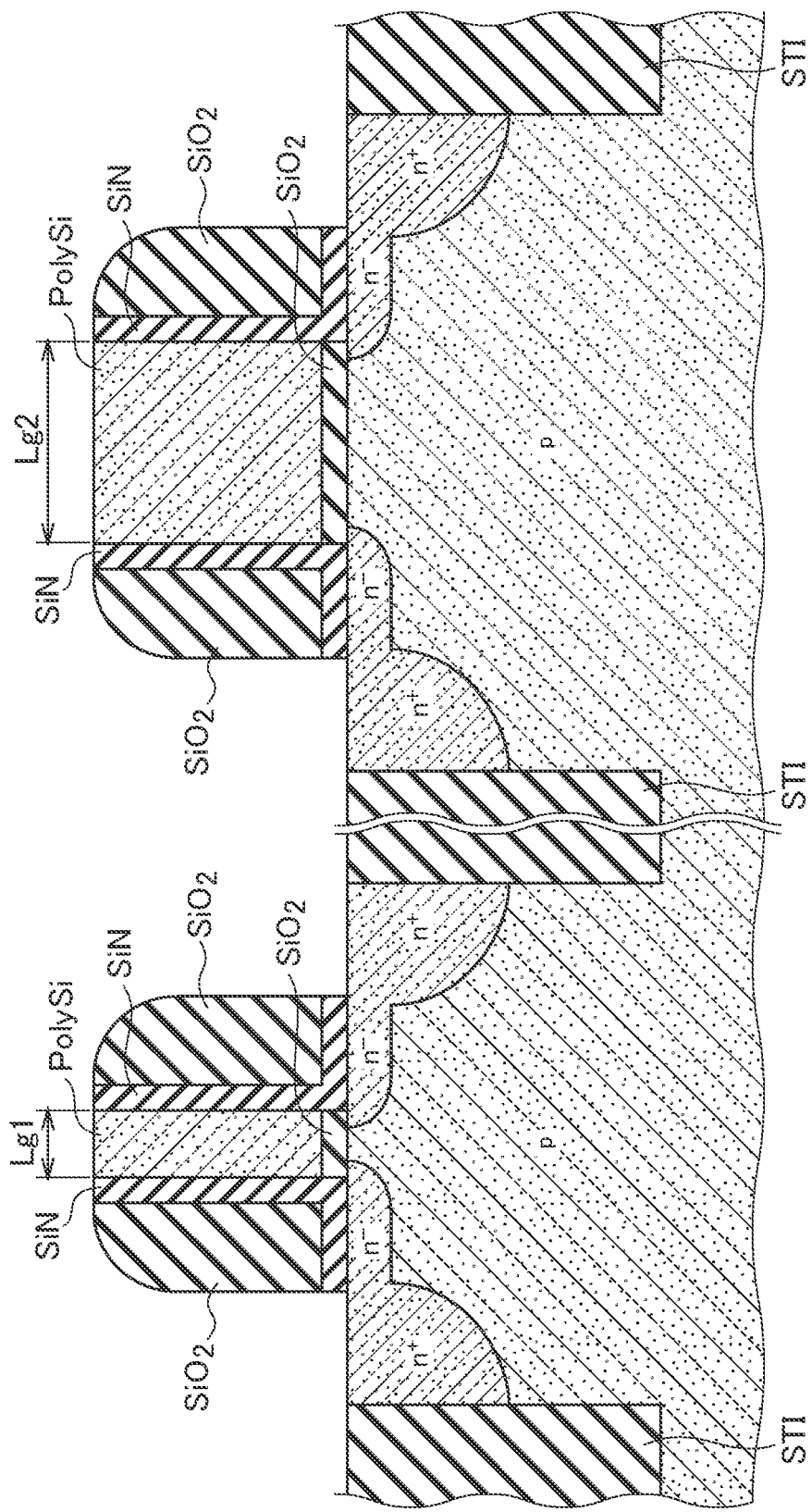
FIG. 12 is a cross-sectional diagram of a device structure in the clock gating cell applicable to the semiconductor device according to some embodiments to which the present technology is applied.

FIG. 12 is a cross-sectional diagram of a device structure in the CG cell 10 applicable to the semiconductor device according to some embodiments to which the present technology is applied. FIG. 12 illustrates an example of a device structure in the CG cell 10.

A gate length Lg2 of the transistor having a high threshold voltage is set to be longer than a gate length Lg1 of the transistor having a low threshold voltage, and thereby the threshold voltage of the n-channel MOSFET having the gate length Lg2 can be increased.

Figure 13:
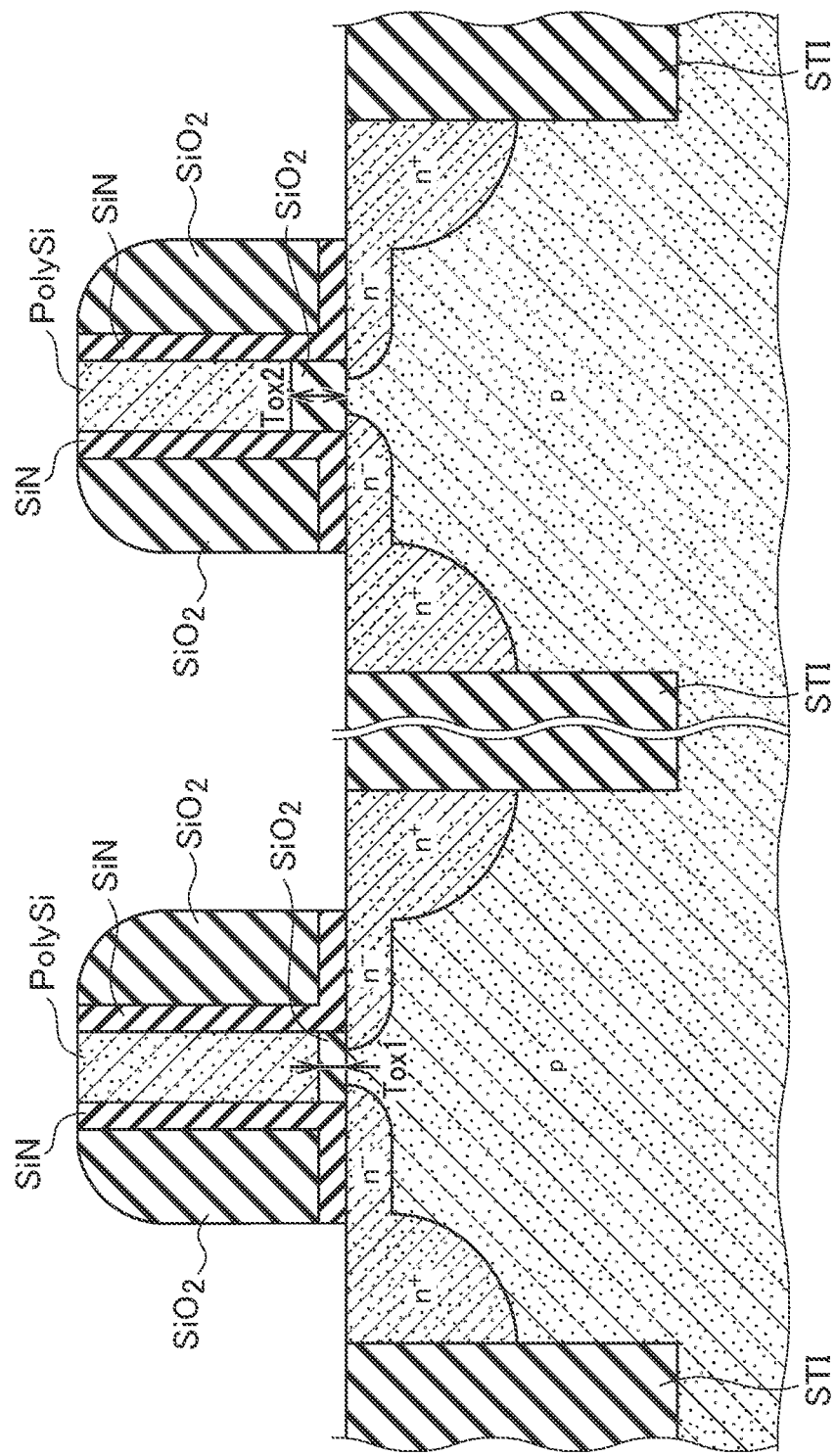
FIG. 13 is a cross-sectional diagram of another device structure in the clock gating cell applicable to the semiconductor device according to some embodiments to which the present technology is applied.

FIG. 13 is a cross-sectional diagram of another device structure in the CG cell 10 applicable to the semiconductor device according to some embodiments to which the present technology is applied. FIG. 13 illustrates an example of a device structure in the CG cell 10.

A film thickness Tox2 of a gate oxide film of the transistor having a high threshold voltage is thicker than a film thickness Tox1 of a gate oxide film of the transistor having a low threshold voltage, and thereby the threshold voltage of the n-channel MOSFET having the film thickness Tox2 can be increased.

Figure 14:
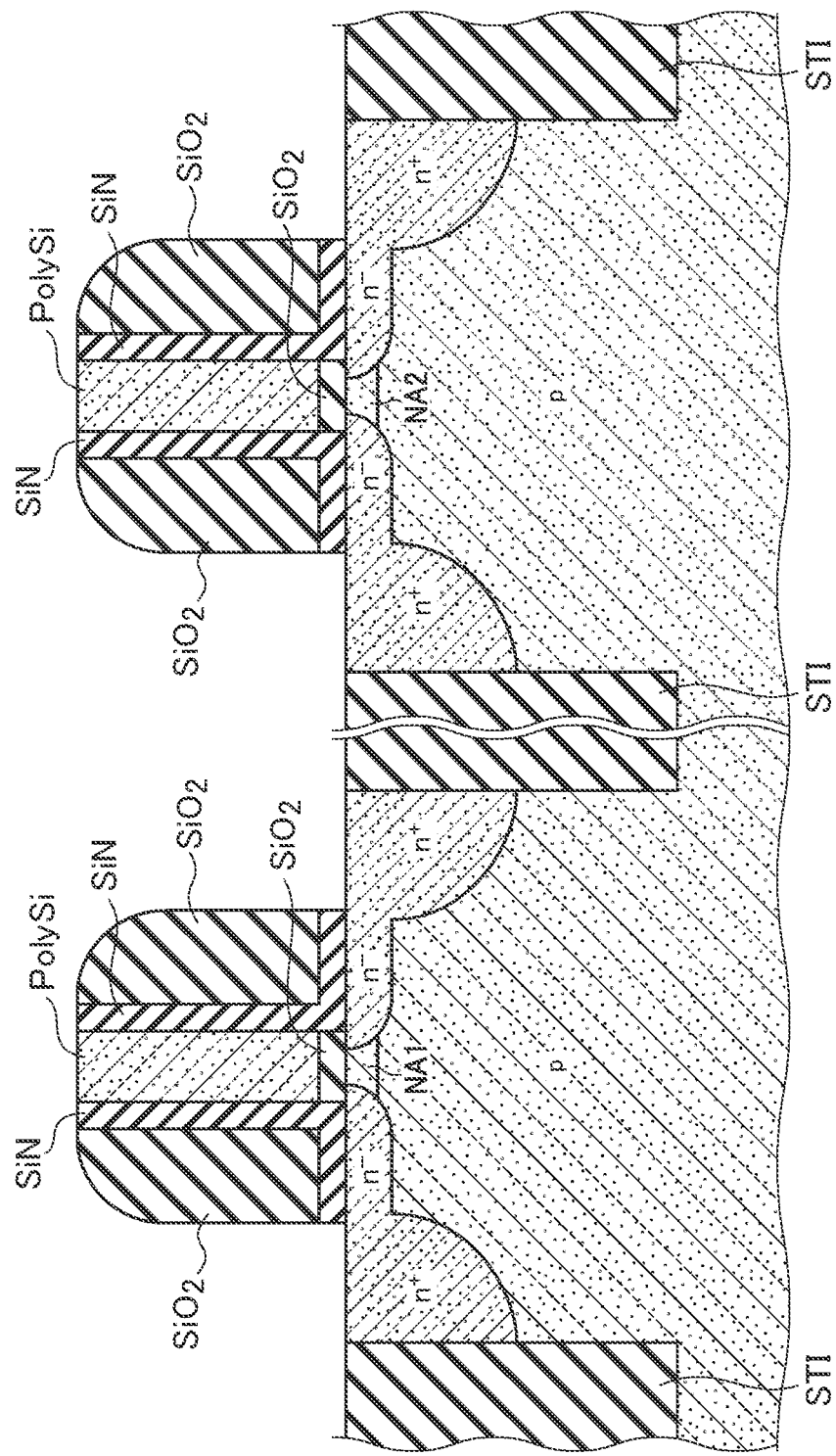
FIG. 14 is a cross-sectional diagram of still another device structure in the clock gating cell applicable to the semiconductor device according to some embodiments to which the present technology is applied.

FIG. 14 is a cross-sectional diagram of another device structure in the CG cell 10 applicable to the semiconductor device according to some embodiments to which the present technology is applied. FIG. 14 illustrates an example of a device structure in the CG cell 10.

An impurity concentration NA2 of a semiconductor region directly under the gate oxide film of the transistor having a high threshold voltage is darker than an impurity concentration NA1 of the semiconductor region directly under the gate oxide film of the transistor having a low threshold voltage, and thereby the threshold voltage of the n-channel MOSFET having the impurity concentration NA2 can be increased.

Figure 15:
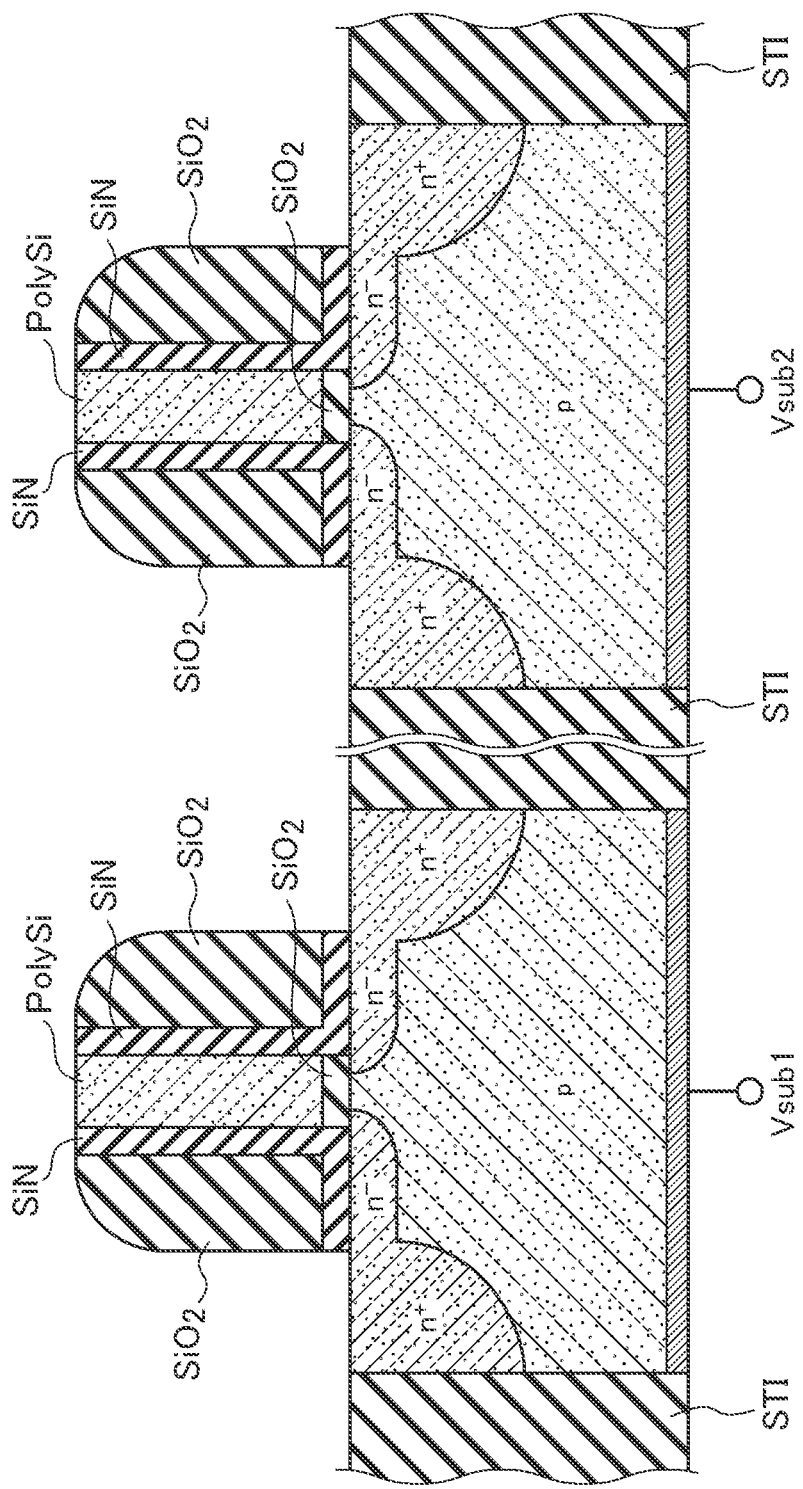
FIG. 15 is a cross-sectional diagram of yet another device structure in the clock gating cell applicable to the semiconductor device according to some embodiments to which the present technology is applied.

FIG. 15 is a cross-sectional diagram of another device structure in the CG cell 10 applicable to the semiconductor device according to some embodiments to which the present technology is applied. FIG. 15 illustrates an example of a device structure in the CG cell 10.

By applying a value of substrate bias voltage of a negative voltage with respect to the source voltage to the transistor having a high threshold voltage having a substrate voltage Vsub2 rather than the transistor having a low threshold voltage having a substrate voltage Vsub1, and thereby the threshold voltage of the n-channel MOSFET can be increased.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Although the n-channel metal oxide semiconductor field effect transistors (MOSFETs) have been described as a representative case as the transistors provided in the CG cell 10 applicable to the semiconductor device 1 according to some embodiment of the present invention, it may be p-channel MOSFETs.

What is claimed is:

1. A semiconductor device comprising:
   a circuit block; and
   a clock circuit configured to supply a clock signal to the circuit block at a specific timing,
   the clock circuit comprising:
   an output circuit configured to provide the clock signal to the circuit block; and
   a control circuit configured to control the timing at which the output circuit provides the clock signal, wherein
   a threshold voltage of at least a transistor in the output circuit using the clock signal as input/output signals is a first threshold voltage,
   a threshold voltage of a transistor configuring a NOT circuit included in the control circuit is a second threshold voltage higher than the first threshold voltage,
   a plurality of the transistors, each constituting the NOT circuit, are included in the control circuit, and
   each transistor constituting the NOT circuit has the second threshold voltage.

2. The semiconductor device according to claim 1, wherein
   the control circuit is a latch circuit configured to sample an enable signal at a rising or falling edge of the clock signal by using the clock signal and the enable signal as input signals, and to provide the sampled enable signal to the output circuit.

3. The semiconductor device according to claim 2, wherein
   the output circuit is an AND circuit using the enable signal provided from the control circuit and the clock signal, as input signals.

4. The semiconductor device according to claim 2, wherein
   the output circuit is an OR circuit using the enable signal provided from the control circuit and the clock signal, as input signals.

5. The semiconductor device according to claim 1, wherein
   a gate length of the transistor of having the first threshold voltage and a gate length of the transistor having the second threshold voltage are different from each other.

6. The semiconductor device according to claim 1, wherein
a film thickness of a gate oxide film of the transistor having the first threshold voltage and a film thickness of a gate oxide film of the transistor having the second threshold voltage are different from each other.

7. The semiconductor device according to claim 1, wherein
an impurity concentration of a semiconductor region under a gate oxide film of the transistor having the first threshold voltage and an impurity concentration of a semiconductor region under a gate oxide film of the transistor having the second threshold voltage are different from each other.

8. A clock circuit configured to supply a clock signal to a circuit block provided in a semiconductor device at a specific timing, the clock circuit comprising:
an output circuit configured to provide the clock signal to the circuit block; and
a control circuit configured to control the timing at which the output circuit provides the clock signal, wherein
a threshold voltage of at least a transistor in the output circuit using the clock signal as input/output signals is a first threshold voltage,
a threshold voltage of a transistor configuring a NOT circuit included in the control circuit is a second threshold voltage higher than the first threshold voltage,
a plurality of the transistors, each constituting the NOT circuit, are included in the control circuit, and
each transistor constituting the NOT circuit has the second threshold voltage.

9. The clock circuit according to claim 8, wherein
the control circuit is a latch circuit configured to sample an enable signal at a rising or falling edge of the clock signal by using the clock signal and the enable signal as input signals, and to provide the sampled enable signal to the output circuit.

10. The clock circuit according to claim 9, wherein
the output circuit is an AND circuit using the enable signal provided from the control circuit and the clock signal, as input signals.

11. The clock circuit according to claim 9, wherein
the output circuit is an OR circuit using the enable signal provided from the control circuit and the clock signal, as input signals.

12. The clock circuit according to claim 8, wherein
a gate length of the transistor of having the first threshold voltage and a gate length of the transistor having the second threshold voltage are different from each other.

13. The clock circuit according to claim 8, wherein
a film thickness of a gate oxide film of the transistor having the first threshold voltage and a film thickness of a gate oxide film of the transistor having the second threshold voltage are different from each other.

14. The clock circuit according to claim 8, wherein
an impurity concentration of a semiconductor region under a gate oxide film of the transistor having the first threshold voltage and an impurity concentration of a semiconductor region under a gate oxide film of the transistor having the second threshold voltage are different from each other.

15. The clock circuit according to claim 8, wherein
a value of substrate bias voltage of the transistor having the first threshold voltage and a value of substrate bias voltage of the transistor having the second threshold voltage are different from each other.

16. A control method of a semiconductor device, the semiconductor device comprising: a circuit block; and a clock circuit configured to supply a clock signal to the circuit block at a specific timing, the control method comprising:
providing, by an output circuit provided in the clock circuit, the clock signal to the circuit block; and
controlling, a control circuit provided in the clock circuit, the timing at which the output circuit provides the clock signal, wherein
a threshold voltage of at least a transistor in the output circuit using the clock signal as input/output signals is a first threshold voltage,
a threshold voltage of a transistor configuring a NOT circuit included in the control circuit is a second threshold voltage higher than the first threshold voltage,
a plurality of the transistors, each constituting the NOT circuit, are included in the control circuit, and
each transistor constituting the NOT circuit has the second threshold voltage.

17. The control method according to claim 16, wherein
the control circuit is a latch circuit, and
the latch circuit is configured to sample an enable signal at a rising or falling edge of the clock signal by using the clock signal and the enable signal as input signals, and to provide the sampled enable signal to the output circuit.

18. The control method according to claim 17, wherein
the output circuit is an AND circuit, and
the AND circuit uses the enable signal provided from the control circuit and the clock signal, as input signals.

19. The control method according to claim 17, wherein
the output circuit is an OR circuit, and
the OR circuit uses the enable signal provided from the control circuit and the clock signal, as input signals.

* * * * *